United States Patent [19]

Hayashi et al.

[11] 4,436,761
[45] Mar. 13, 1984

[54] METHOD FOR TREATMENT OF METAL SUBSTRATE FOR GROWTH OF HYDROGEN-CONTAINING SEMICONDUCTOR FILM

[75] Inventors: Yutaka Hayashi; Mitsuyuki Yamanaka; Hideyuki Karasawa, all of Ibaraki, Japan

[73] Assignees: Agency of Industrial Science & Technology; Ministry of International Trade & Industry, both of Tokyo, Japan

[21] Appl. No.: 401,813

[22] Filed: Jul. 26, 1982

[30] Foreign Application Priority Data

Jul. 30, 1981 [JP] Japan ................... 56-119874

[51] Int. Cl.³ .............................................. B05D 3/06

[52] U.S. Cl. ......................................... 427/38; 427/39; 427/86; 136/258

[58] Field of Search .............................. 427/38, 39, 86

[56] References Cited

U.S. PATENT DOCUMENTS 4,200,473  4/1980  Carlson ................................. 427/39

Primary Examiner—John H. Newsome
Attorney, Agent, or Firm—Oblon, Fisher, Spivak, McClelland & Maier

[57] ABSTRACT

In the deposition of a hydrogen-containing semiconductor film on a metal substrate, the electric contact characteristic between the metal substrate and the semiconductor film is improved by preparatorily exposing to hydrogen plasma the surface of the metal substrate on which the semiconductor film is to be deposited.

5 Claims, 7 Drawing Figures

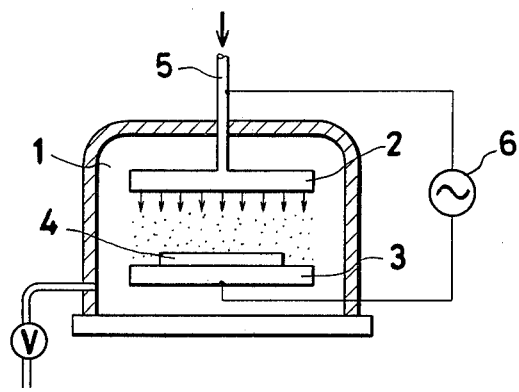
Fig_1
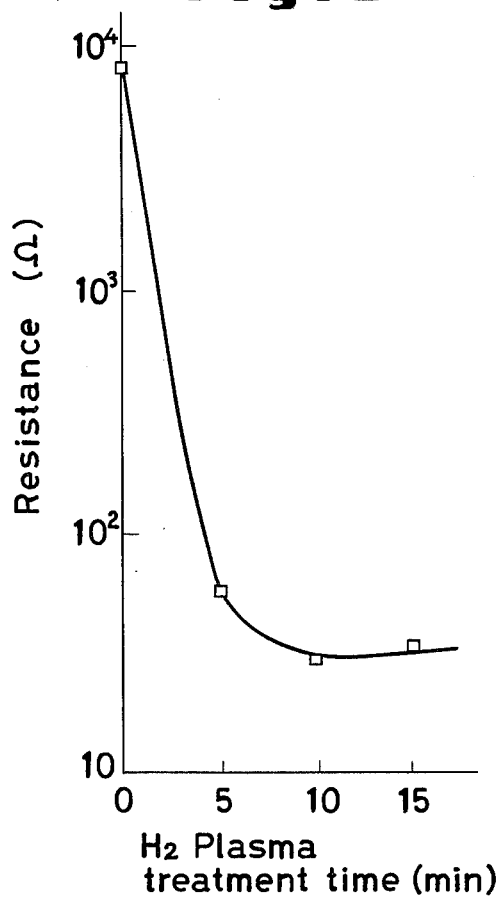
Fig_2
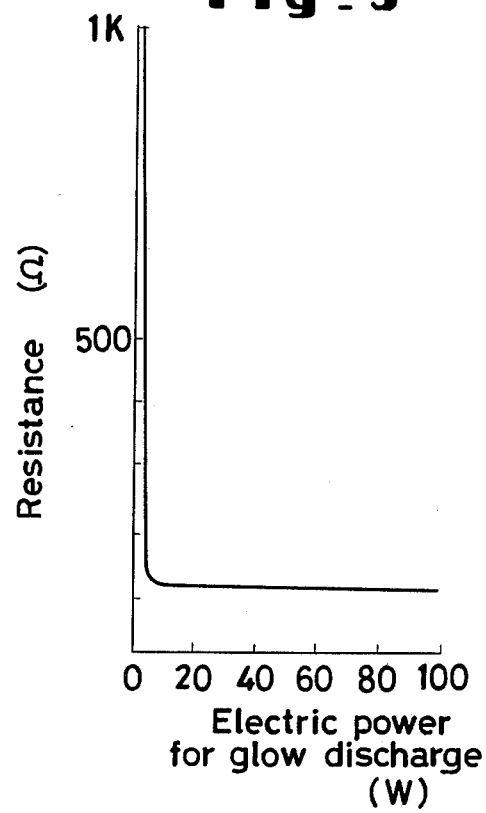
Fig_3
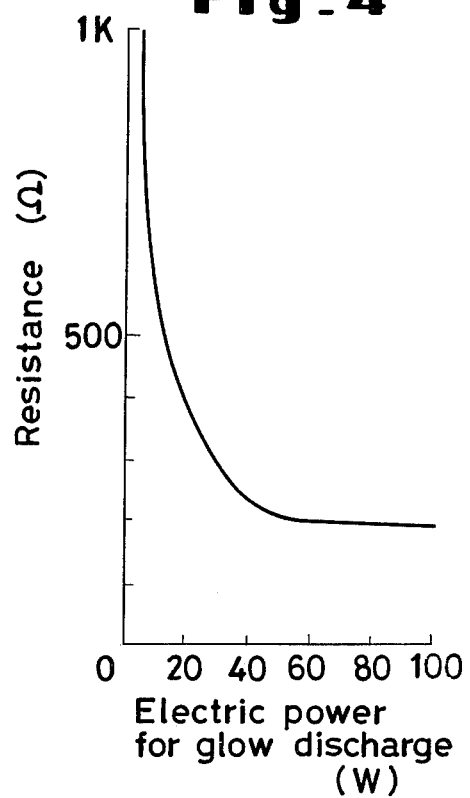
Fig_4

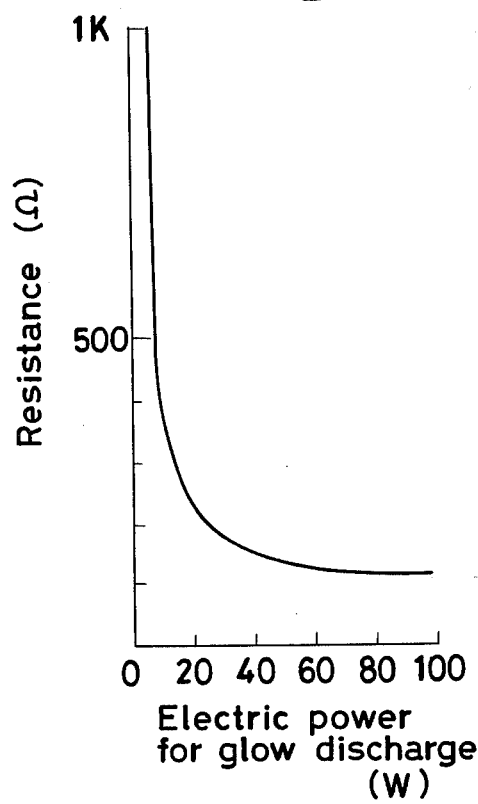
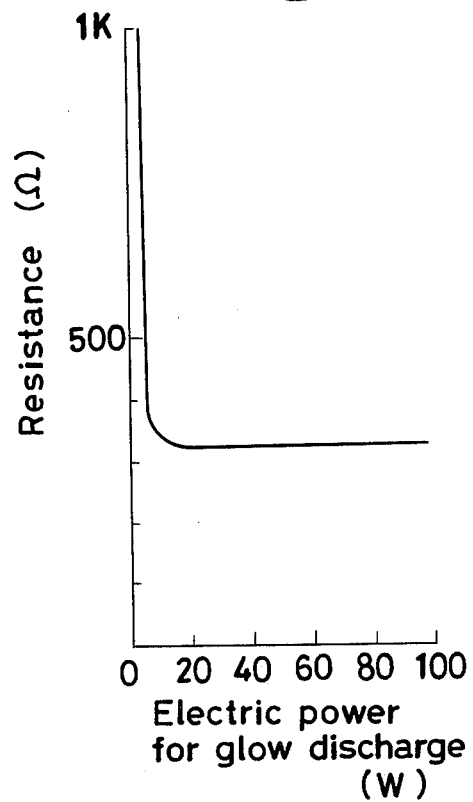
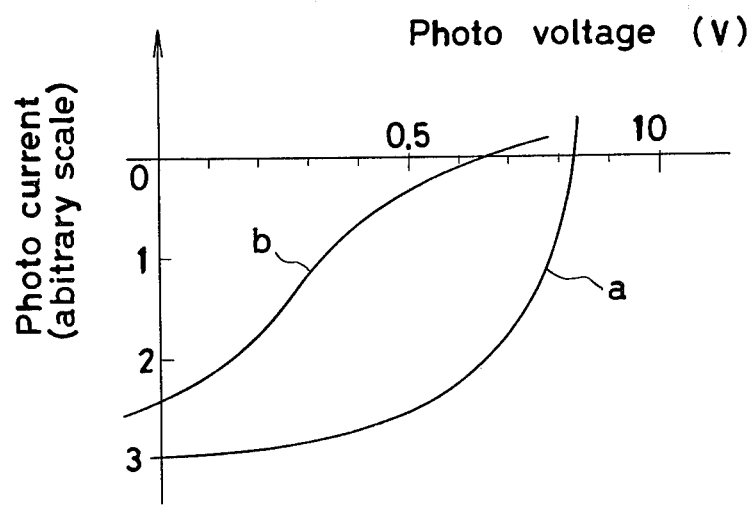

METHOD FOR TREATMENT OF METAL SUBSTRATE FOR GROWTH OF HYDROGEN-CONTAINING SEMICONDUCTOR FILM

BACKGROUND OF THE INVENTION

This invention relates to a method for the treatment of a metal substrate for the growth of a hydrogen-containing semiconductor film.

Amorphous silicon possesses a great ability to absorb light and a consequent outstanding photoconductive property. Owing to these excellent properties, amorphous silicon is expected to find utility in applications to solar batteries, photoelectric conversion elements, etc. Among the methods heretofore proposed for the manufacture of amorphous silicon, there are included a glow discharge method which comprises exposing a molecular gas such as silane ($SiH_4$) with a reduced pressure to glow discharge inside a reactor thereby decomposing the silane and causing the produced silicon to be deposited on a metal substrate placed inside the reactor and a reactive sputtering method which comprises sputtering solid silicone out in an atmosphere containing hydrogen and causing the sputtered silicon to be deposited on a metal substrate. In preparation for the growth of a hydrogen-containing silicon composite on a metal substrate as described above, the surface of the metal substrate is cleansed with an organic solvent or subjected to a chemical etching treatment using an aqueous solution. The electric contact property between the formed silicon film and the metal substrate, however, cannot be obtained with high repeatability. This lack of repeatability of the electric contact property has posed itself a problem in the fabrication of devices using amorphous silicon. For example, it has been difficult to afford required control of the properties of barrier height and barrier width between the film of amorphous silicon and the metal substrate and it has been infeasible to establish an ohmic contact between the semiconductor and the metal substrate with high uniformity or high repeatability when the semiconductor containing p-type or n-type impurities excessively.

Recently, there has been proposed a method in which, in the same vacuum system, a metal substrate is formed and, subsequently, a film of amorphous silicon is continuously deposited on the metal substrate. This method entails a technically complicated procedure and fails to provide the contact property with high repeatability.

SUMMARY OF THE INVENTION

An object of this invention is to provide a method for the pretreatment of a metal substrate, which provides an excellent electric contact property of high repeatability between a metal substrate and a semiconductor film to be formed on the metal substrate.

To accomplish the object described above according to this invention, there is provided a method which comprises preparatorily exposing to hydrogen plasma the portion of a metal substrate destined to be covered with a deposit of a hydrogen-containing semiconductor film and thereafter allowing the semiconductor film to be deposited on the pretreated surface of the metal substrate. By simply exposing the prescribed surface of the metal substrate to the hydrogen plasma, the electric contact property between the semiconductor film and the metal substrate is improved and this property is obtained with high repeatability.

The other objects and features of this invention will become apparent to those skilled in the art from the further disclosure to be made herein, as illustrated in the accompanying drawings.

BRIEF DESCRIPTION OF THE DRAWING

FIG. 1 is an explanatory view illustrating one embodiment of the device for working the present invention.

FIG. 2 is a graph showing the relation of the magnitude of resistance between an amorphous silicon film and a metal substrate to the duration of the plasma treatment performed on the substrate.

FIG. 3 is a graph illustrating the relation of the magnitude of resistance between a boron-containing amorphous silicon film and a stainless steel substrate to the magnitude of electric power for the formation of hydrogen plasma.

FIG. 4 is a graph illustrating the relation of the magnitude of resistance between a phosphorus-containing amorphous silicon film and a stainless steel substrate to the magnitude of electric power for the formation of hydrogen plasma.

FIG. 5 is a graph illustrating the relation of the magnitude of resistance between a boron-containing amorphous silicon film and a glass substrate having a Cr film vacuum deposited thereon to the magnitude of electric power for the formation of hydrogen plasma.

FIG. 6 is a graph illustrating the relation of the magnitude of resistance between a phosphorus-containing amorphous film and a glass substrate having a Cr film vacuum deposited thereon to the magnitude of electric power for the formation of hydrogen plasma.

FIG. 7 is a graph illustrating typical output characteristic obtained of a solar battery formed by using a substrate treated by the method of the present invention.

DESCRIPTION OF PREFERRED EMBODIMENT

In solar batteries which are formed by depositing an amorphous silicon film on metal substrates, the photoelectric conversion efficiency varies in the range of 3% to 5%. The reason for this dispersion of the coefficiency is that the electric contact characteristics between the amorphous silicon film and the metal substrates are not always acquired with high repeatability. The inventors continued diligent study and experiments in search for a method capable of producing electric contact characteristics with high repeatability between the amorphous film and the metal substrates. They have consequently found that when the surface of a metal substrate on which a hydrogen-containing semiconductor film like an amorphous silicon film is desired to be grown is treated with hydrogen plasma before the semiconductor film is deposited thereon, the electric contact characteristic between the substrate and the deposited film is improved enough to preclude otherwise possible dispersion. This invention has been perfected on the basis of this discovery.

This invention is applicable to a semiconductor film of any type on condition that the film contains hydrogen. Examples of the semiconductor films to which this invention is applicable are semiconductor of single crystal, microcrystalline semiconductor, polycrystalline semiconductor, and amorphous semiconductor. Particularly, this invention is advantageously applied to the formation of amorphous films such as amorphous silicon film, amorphous germanium film, and amorphous silicon carbide film. These films may incorporate fluorine, nitrogen, or some other atom besides hydrogen.

As the substrate on which the aforementioned semiconductor film is to be deposited, any of the known substrates such as substrates of stainless steel and other metals and substrates formed by vacuum depositing nickel, chromium, and other metals on glass bases can be used in their unaltered form.

Such a metal substrate is cleansed by an ordinary method and then set in position in an apparatus for the growth of a semiconductor film. Then, the surface of this substrate on which the semiconductor film is desired to be deposited is exposed to hydrogen plasma which is generated by delivering to the electrodes of the apparatus electric power for glow discharge. After this exposure, the semiconductor film is deposited on the treated surface of the metal substrate.

The working of this invention by use of an amorphous silicon production system of the capacitive coupling glow discharge method illustrated in FIG. 1 will be described below by way of illustration. Referring to FIG. 1, a pair of disc-like glow discharge electrodes 2, 3 are vertically opposed to each other across a fixed distance inside a vacuum chamber 1 and are connected to a power supply 6. The electrode 2 has a cavity therein. This cavity communicates with a gas feed pipe 5 which terminates on the other end thereof in a gas source (not shown) installed outside the vacuum chamber 1. The electrode 2 is provided in the lower side thereof with a multiplicity of spouts for projecting the gas brought in through the pipe 5. The upper side of the electrode 3 is used for holding a metal substrate 4 for the deposition of a semiconductor film. The electrode 3 contains a built-in heater which serves to heat the substrate 4 to a prescribed temperature.

In the system constructed as described above, a given metal substrate which has been given a stated cleansing treatment is mounted in position on the electrode 3. The vacuum chamber 1 is vacuumized to the order of 0.1 to 2 torrs and then filled with hydrogen introduced via the pipe 5 to form an atmosphere of hydrogen therein. Then, the substrate 4 is heated by the built-in heater of the electrode 3 to a temperature ranging from room temperature up to 500° C. To the electrodes 2, 3, a high-frequency electric power is applied from the power supply 6 to generate hydrogen plasma between the opposed electrodes. Consequently, the open surface of the substrate 4 is exposed to the hydrogen plasma thus generated. The electric power to be applied between the two electrodes 2, 3 may be a direct current, a low-frequency current, or a high-frequency current. The effect of this invention is obtained without reference to frequency of the electric power to be used. Optionally, the treatment of the substrate may be effected by using hydrogen plasma which has been excited with a microwave in a separate chamber. In other words, the treatment can be carried out as aimed at by this invention insofar as means capable of generating hydrogen plasma is provided inside the vacuum chamber.

After the treatment of the substrate with the hydrogen plasma described above is completed, the raw material for a semiconductor in a gaseous form is supplied to the substrate via the gas feed pipe 5 and glow discharge is generated to effect required deposition of a semiconductor film on the surface of the substrate. When an amorphous silicon film is desired to be formed, for example, monosilane ($SiH_4$) alone or a mixed gas of monosilane with a required amount of such an additive gas as argon, nitrogen, or ammonia gas is introduced via the gas feed pipe 5 into the vacuum chamber 1, the substrate 4 is heated to 150° to 400° C., and an electric power, 5 to 100 W, for glow discharge is supplied to the electrodes 2, 3. Consequently, an amorphous silicon film is formed on the substrate. Formation of a film of microcrystalline silicon on the substrate is accomplished by introducing into the vacuum chamber 1 a mixed gas consisting of monosilane and hydrogen in a mixing ratio of 1:100 (min.) and applying to the electrodes an RF power of at least 50 W. Formation of a film of amorphous silicon-germanium mixed phase on the substrate is accomplished by introducing into the vacuum a mixed gas of monosilane and germane ($GeH_4$). Formation of a film of amorphous silicon carbide is accomplished by supplying a mixed gas of monosilane and methane ($CH_4$) to the vacuum chamber. The formation of such a semiconductor film as described above on the substrate can be carried out by adopting any of the conventional methods without any modification.

The duration of the treatment of the substrate with hydrogen plasma is a matter to be decided in due consideration of the construction of the system, the electric power supplied, the conditions of the treatment, the kind of the substrate, etc. In a typical experiment by use of a system of the construction of FIG. 1, a substrate of stainless steel had its surface treated with hydrogen plasma generated by application of an electric power of 50 W to the electrodes and then an amorphous silicon film 5000 Å in thickness was formed on the substrate by supplying a monosilane gas containing 1 vol% of phosphine into the vacuum chamber and applying an electric power of 20 W to the electrodes. An electrode was attached to the silicon film and the resistance between the electrode and the substrate was measured. The relation of the magnitude of the resistance between the electrode and the substrate to the duration of the treatment of the substrate with hydrogen plasma was investigated. The results were as shown in FIG. 2. From the graph of FIG. 2, it is noted that the effect of the treatment with hydrogen plasma began to appear conspicuously after 5 minutes of the treatment and no addition to this effect was observed after 15 minutes of the treatment. In due consideration of the test results indicated above, the duration of the treatment with the hydrogen plasma generally is thought to be proper in the range of about 5 to 20 minutes.

It is inferred that when the surface of the metal substrate on which the hydrogen-containing semiconductor film is to be formed is treated in advance with hydrogen plasma, the oxide film formed from the beginning on the surface of the substrate is removed and reduced and part of the hydrogen of the hydrogen plasma is adsorbed on the surface of the substrate. It is further inferred that when the hydrogen-containing semiconductor film is formed on the surface of the substrate which is rich in hydrogen, the deficiency of hydrogen in the region of the film close to the interface between the film and the substrate is eliminated and the possible transference of hydrogen ceases to exist. It is, therefore, concluded that the electric contact characteristic between the metal substrate and the semiconductor film is improved, that the electric contact characteristic of high level is obtained with high repeatability, and that the electric properties in the region of the produced semiconductor film close to the substrate are similarly improved.

The working of this invention described so far has involved use of a semiconductor film production system of the capacitive coupling glow discharge method. To those skilled in the art, it ought to be self-evident that the present invention can be worked similarly effectively with a semiconductor film production system of the inductively coupled glow discharge method or with a semiconductor film production system of the sputtering method which are both known to the art.

As described above, the present invention provides desired control of the electric contact characteristic between the metal substrate and the hydrogen-containing semiconductor film, provides improvements in the characteristics of the devices formed by using the aforementioned semiconductor film, and materializes such improved characteristics with high repeatability. This invention, therefore, will contribute greatly to the techniques for the production of semiconductor devices.

Now, the present invention will be described specifically below with reference to working examples. It should be noted that the examples are not limitative of this invention in any sense.

EXAMPLE 1

In a semiconductor film production system of the construction of FIG. 1 wherein the pair of disc-like electrodes has a diameter of 200 mm and they were separated from each other by a distance of 35 mm in a chamber. A substrate made of stainless steel (SUS 304) cleansed with an organic solvent (methanol and acetone) and rinsed with deionized water was set in position on the lower electrode. The chamber was vacuumized to 0.03 torr and then filled with hydrogen up to 1 torr. In the vacuum chamber, the substrate was heated to about 180° C. and varying electric power, 0 to 100 W, for the generation of plasma was applied to the electrodes to treat the surface of the substrate for 20 minutes. After this treatment, a monosilane ($SiH_4$) gas containing 2 vol% of diborane ($B_2H_6$) was supplied at a flow rate of 20 cc/min. to the vacuum chamber for 30 minutes, with the substrate kept at 180° C. and the electrodes supplied with an electric power of 20 W. Consequently, an amorphous silicon film 4000 Å in thickness containing boron as a p-type impurity was formed on the substrate. Then, an electrode 1 mm in diameter was deposited on the upper side of the amorphous silicon film to measure resistance between this electrode and the substrate. The results were as shown in the graph of FIG. 3. In the case of the semiconductor film formed on the substrate to which the treatment with hydrogen plasma had not been given, the value of resistance between the film and the substrate was much greater than 1 k$\Omega$. In the case of the semiconductor film formed on the substrate which had undergone the treatment with hydrogen plasma at an electric power of 5 W, the value of resistance was about 125$\Omega$. This value of resistance was hardly increased when the electric power for the generation of hydrogen plasma was increased beyond this level of 5 W. By repeating the procedure described above, except that a monosilane gas containing 1 vol% of phosphine ($PH_3$) was supplied to the vacuum chamber instead of the monosilane gas containing diborane, there was formed an amorphous silicon film 3000 Å in thickness and containing phosphorus as an n-type impurity on the substrate of stainless steel. Similarly, the resistance between the film and the substrate was measured. The results were as shown in the graph of FIG. 4. It is noted from the graph that the value of resistance began to fall when the electric power used for the treatment of the substrate with hydrogen plasma increased beyond 20 W. In the case of the film formed on the substrate which had been treated with hydrogen plasma with an electric power of about 40 W, the value of resistance between the substrate and the film was as low as about 180$\Omega$. Substantially no further increase of the value of resistance could be obtained when the electric power for the treatment of hydrogen plasma was increased beyond the level of 40 W.

The amorphous silicon films obtained as described above were tested for resistivity. When an electrode 1 mm in diameter was attached to the semiconductor film, the resistance between the electrode and the substrate without the hydrogen plasma treatment was not ohmic and evidently suggestive of the presence of a large barrier width, although theoretically the junction ought to constitute an ohmic contact involving about 1$\Omega$/cm$^2$ of resistance. In the case of the amorphous film containing a p-type impurity, the ohmic property was satisfactory and the value of resistance was substantially equal to that of low saturated resistance when the substrate had undergone the hydrogen plasma treatment at an electric power of 5 W.

EXAMPLE 2

The procedure of Example 1 was repeated, except that a substrate formed by vacuum depositing a chromium film on a glass plate was used in the place of the substrate of stainless steel. The substrate was treated with hydrogen plasma by using varying electric power as mentioned in Example 1. Consequently, there were obtained amorphous silicon films containing boron and amorphous silicon films containing phosphorus. The resistance between the chromium-deposited glass substrate and the amorphous silicon film was measured. The results of the former were as shown in FIG. 5 and those of the latter in FIG. 6. In the case of the amorphous silicon films containing boron, the value of resistance conspicuously fell when the substrates were treated with hydrogen plasma generated at electric powers exceeding 20 W. The resistance reached a low saturated value of about 125$\Omega$ when the electric power was 50 W. In the case of the amorphous silicon films containing phosphorus, the resistance reached a low saturated value of 310$\Omega$ when the electric power used for the hydrogen plasma treatment was 10 W. As described above, although the value of contact resistance varied with the material or the film and that of the substrate, it was very little dispersed when the material of the film and that of the substrate were fixed.

EXAMPLE 3

A substrate of stainless steel (SUS 304) was mounted in position on the lower electrode in the semiconductor film production system of Example 1. The vacuum chamber was evacuated to 0.03 torr and then filled with hydrogen up to 1 torr. The substrate was heated to 200° C. and an electric power of 50 W was applied to the electrodes to generate hydrogen plasma and treat the substrate with the hydrogen plasma for 20 minutes. Then, a monosilane ($SiH_4$) gas containing 2 vol% of diborane ($B_2H_6$) was supplied to the vacuum chamber to deposit an amorphous silicon film of p-type 300 Å in thickness on the substrate. Then, the low pressure plasma deposition was continued by switching the raw gas to a pure monosilane gas, to form an undoped amorphous silicon film 5000 Å in thickness on top of the aforementioned p-type silicon film. Subsequently, the low pressure plasma deposition was again continued by switching the raw gas to a monosilane gas containing 1 vol% of phosphine ($PH_3$), to form an n-type amorphous silicon film 100 Å on top of the aforementioned undoped amorphous silicon film.

The laminated amorphous silicon film formed as described above was used as a solar battery. It was irradiated with a simulated solar ray of 70 mW/cm$^2$, with the resultant photo voltage ($V_{OC}$) and the photoelectric current ($I_{SC}$) measured. The results were as shown in the graph of FIG. 7. For the purpose of comparison, a laminated amorphous silicon film was formed under the same conditions as described above on a substrate of stainless steel which had not undergone the treatment with hydrogen plasma. This film was similarly irradiated with the simulated solar ray, with the photo voltage and the photoelectric current measured.

In the graph of FIG. 7, the curve "a" represents the values obtained of the solar battery formed of the laminated amorphous film according to the present invention and the curve "b" those obtained of the solar battery formed of the laminated amorphous film on the substrate which had not undergone the hydrogen plasma treatment. Comparison of the two curves clearly shows that the open circuit photo voltage and the short circuit photo voltage of the solar battery of this invention far exceeded those of the solar battery not conforming to the present invention. The solar battery according to this invention showed a fill factor of about 0.56, whereas the solar battery not conforming to this invention showed a fill factor of about 0.22. This difference implies the remarkable effect of the hydrogen plasma treatment performed on the substrate.

What is claimed is:

1. A method for the treatment of a cleaned metal substrate for the growth of a hydrogen-containing semiconductor film on said metal substrate which comprises exposing the surface of said cleaned metal substrate on which said semiconductor film is to be deposited to plasma consisting essentially of hydrogen in advance of the deposition thereon of said semiconductor film to cause hydrogen to be adsorbed on the surface of the substrate, thereby improving the electric contact characteristic between the metal substrate and the semiconductor film deposited thereon.

2. The method according to claim 1, wherein subsequently to the exposure of the surface of the metal substrate to hydrogen plasma, the semiconductor film is deposited in situ on the treated surface of the metal substrate.

3. The method according to claim 1, wherein the metal substrate is made of stainless steel.

4. The method according to claim 1, wherein the metal substrate is formed by coating a glass base with a Cr film.

5. The method according to claim 1, wherein the semiconductor film is an amorphous silicon film.

* * * * *